United States Patent
Ametani (10) Patent No.: US 7,503,365 B2
(45) Date of Patent: Mar. 17, 2009

(54) DICING TAPE ATTACHING APPARATUS AND DICING TAPE ATTACHING METHOD

(75) Inventor: Minoru Ametani, Mitaka (JP)

(73) Assignee: Tokyo Seimitsu Co., Ltd., Tokyo (JP)

(*) Notice: Subject to any disclaimer, the term of this patent is extended or adjusted under 35 U.S.C. 154(b) by 75 days.

(21) Appl. No.: 11/601,371

(22) Filed: Nov. 17, 2006

(65) Prior Publication Data

US 2007/0123000 A1 May 31, 2007

(30) Foreign Application Priority Data

Nov. 25, 2005 (JP) ............................. 2005-340145

(51) Int. Cl.
*B32B 41/00* (2006.01)

(52) U.S. Cl. .................... 156/353; 156/358; 156/360; 156/362; 156/363

(58) Field of Classification Search ............... 156/64, 156/353, 358, 360, 361, 362, 363, 250, 522, 156/523

See application file for complete search history.

(56) References Cited

U.S. PATENT DOCUMENTS

| | | | |
|---|---|---|---|
| 4,925,515 A | 5/1990 | Yoshimura et al. | |
| 5,930,654 A | 7/1999 | Tohyama et al. | |
| 5,961,768 A | 10/1999 | Tsujimoto | |
| 6,767,426 B1 | 7/2004 | Yamamoto | |
| 2003/0062116 A1 | 4/2003 | Lee | |
| 2003/0064592 A1 | 4/2003 | Yamamoto | |
| 2005/0282362 A1* | 12/2005 | Kobayashi et al. | .......... 438/464 |

FOREIGN PATENT DOCUMENTS

| | | |
|---|---|---|
| EP | 1 263 026 A2 | 12/2002 |
| EP | 1 328 011 A2 | 7/2003 |
| EP | 1 381 076 A2 | 1/2004 |
| EP | 1 617 462 A2 | 1/2006 |
| EP | 1 729 336 A1 | 12/2006 |
| JP | 7-24780 | 1/1995 |

(Continued)

OTHER PUBLICATIONS

European Search Report dated Dec. 17, 2007 for corresponding European Patent Application No. 06 124 389.5, indicating the relevance of WO 2005/101486.

(Continued)

*Primary Examiner*—George R Koch, III
(74) *Attorney, Agent, or Firm*—Christie, Parker & Hale, LLP (57) ABSTRACT

A dicing tape attaching apparatus (10) comprises a fixed table (38) for supporting a mount frame (36), a movable table (31) for supporting a wafer (20) with the reverse surface thereof ground, and a height adjusting unit (70) such as a screw jack for adjusting the height of the movable table. When the dicing tape (3) is attached on the mount frame and the wafer, the height adjusting unit such as the screw jack so operates that the height of the dicing tape attaching surface of the wafer supported on the movable table coincides with the height of the upper surface of the mount frame supported on the fixed table. As a result, the wafer is prevented from forming cuts, cracks and internal distortions.

7 Claims, 8 Drawing Sheets

FOREIGN PATENT DOCUMENTS

| | | |
|---|---|---|
| JP | 10-27836 | 1/1995 |
| JP | 7-183365 | 7/1995 |
| JP | 10-284564 | 10/1998 |
| JP | 2002-134438 | 5/2002 |
| JP | 2002-222779 A | 8/2002 |
| JP | 2004-047976 | 2/2004 |
| WO | WO 2005/101486 | 10/2005 |

OTHER PUBLICATIONS

Patent Abstracts of Japan, Publication No. 2002134438, dated May 10, 2002, in the name of Shigeki Tanigawa.
European Search Report dated Apr. 10, 2007, for EP06124389.5, in the name of Tokyo Seimitsu Co., Ltd.
Patent Abstracts of Japan, Publication 07183365, Published Jul. 21, 1995, in the name of Akatani.
Patent Abstracts of Japan, Publication 10027836, Published Jan. 27, 1998, in the name of Yamanaka.
Patent Abstracts of Japan, Publication 10284564, Published Oct. 23, 1998, in the name of Hasegawa.
Australian Patent Office Examination/Search Report dated Jun. 16, 2006 for corresponding SG 200501479-0, in the name of Tokyo Seimitsu Co., Ltd.
European Search Report for application No. 05251381.9, dated Jun. 14, 2006, in the name of Tokyo Seimitsu Co., Ltd.
Patent Abstracts of Japan, Publication No. 07-024780, dated Jan. 27, 1995, in the name of Hiroshi Maurai et al.
Patent Abstracts of Japan, Publication No. 2004-047976, dated Feb. 12, 2004, in the name of Masayuki Yamamoto et al.
Singapore Search Report for SG 200607949-5, corresponding to priority JP 2005-340145. Feb. 2007.

* cited by examiner

DICING TAPE ATTACHING APPARATUS AND DICING TAPE ATTACHING METHOD

CROSS-REFERENCE TO RELATED APPLICATION

This application claims priority of Japanese Application Number 2005-340145, filed on Nov. 25, 2005.

BACKGROUND OF THE INVENTION

1. Field of the Invention

This invention relates to a dicing tape attaching method, for attaching a dicing tape on the back surface of a wafer, and to a dicing tape attaching apparatus for carrying out the method.

2. Description of the Related Art

In the semiconductor fabrication field, wafers have increased in size every year, on the one hand, and, in order to increase the mounting density, the thickness of the wafer has been reduced. The thickness of the wafer is reduced by a back grind process which grinds the back surface of the semiconductor wafer. In the back grind process, a surface protective tape is attached on the front surface of the wafer to protect the semiconductor elements formed on the front surface.

Figure 7:
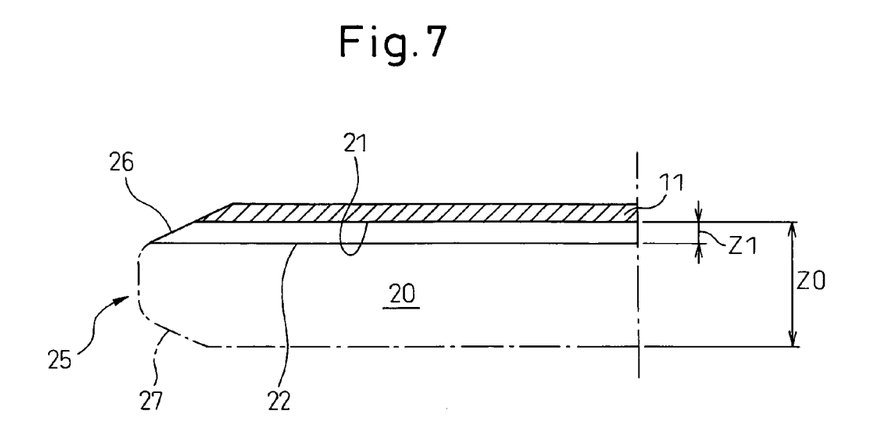
FIG. 7 is an enlarged sectional view of the wafer with a surface protective film attached thereon.

FIG. 7 is an enlarged sectional view of a circular wafer with a surface protective film attached on the front surface of the wafer. As can be understood from FIG. 7, the edge portion 25 of the circular wafer 20 is originally chamfered. Also, a surface protective film 11 is attached on the front surface 21 of the wafer 20. As shown in FIG. 7, in the case where the wafer 20 is back ground and reduced in thickness from Z0 to Z1, the chamfered portion 27 on the back surface of the wafer 20 is cut off, and the new back surface 22 (ground surface) of the wafer 20 reaches the chamfered portion 26 of the front surface.

Figure 8:
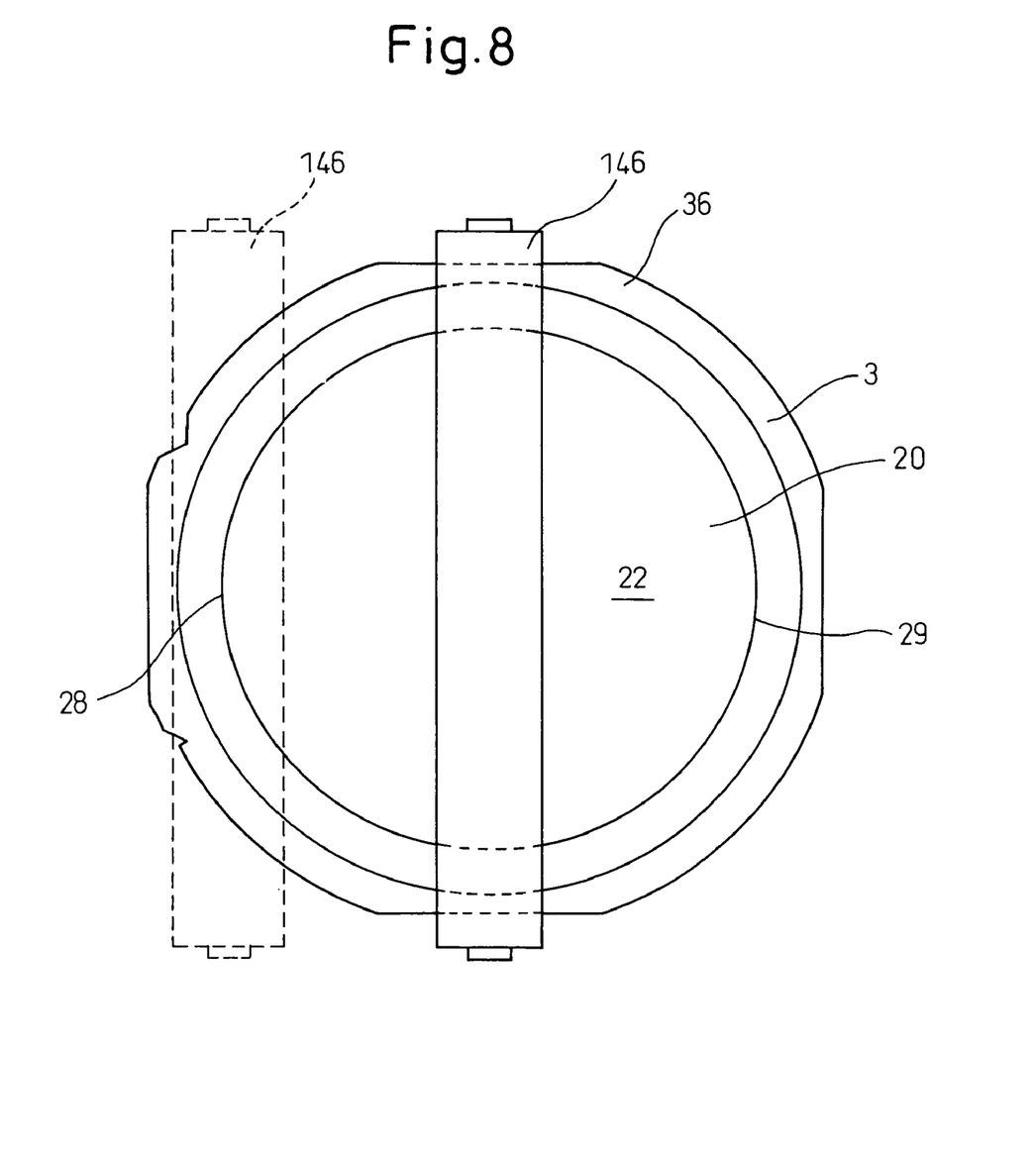
FIG. 8 is a top plan view of the wafer integrated with the mount frame.

Next, as shown in FIG. 8, the wafer 20 is inverted with the back surface 22 up and arranged in a mount frame 36 somewhat larger than the wafer 20. By moving an attaching roll 146, such as a rubber roll, from one end to the other of the mount frame 36, the dicing tape 3 is attached on both the wafer 20 and the mount frame 36. As a result, the back ground wafer 20 is integrated with the mount frame 36 for an improved handling characteristic of the wafer 20 in the subsequent processes.

Figure 9A:
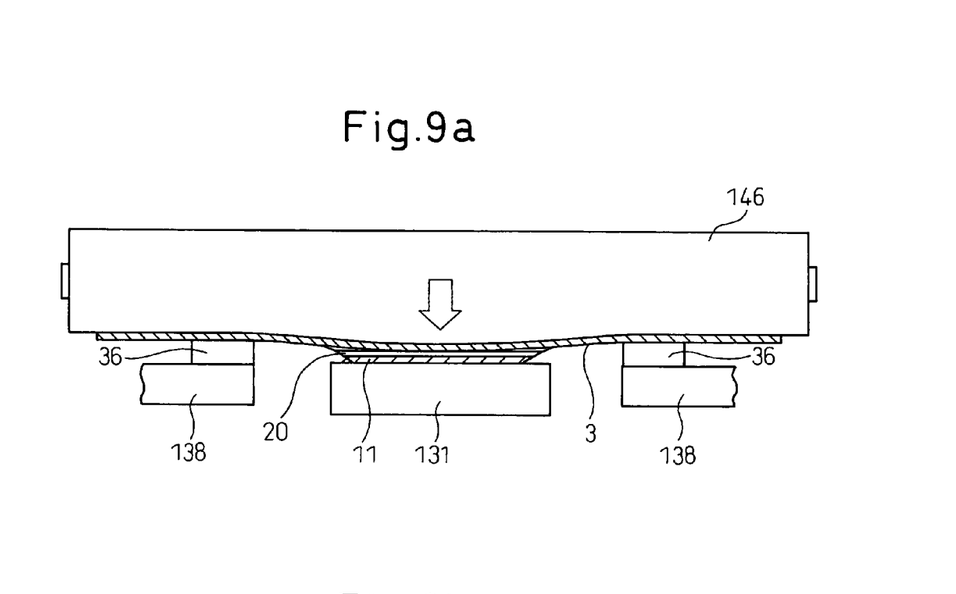
FIG. 9a is a sectional view as taken along the attaching roll shown by the dotted line in FIG. 8.
Figure 9B:
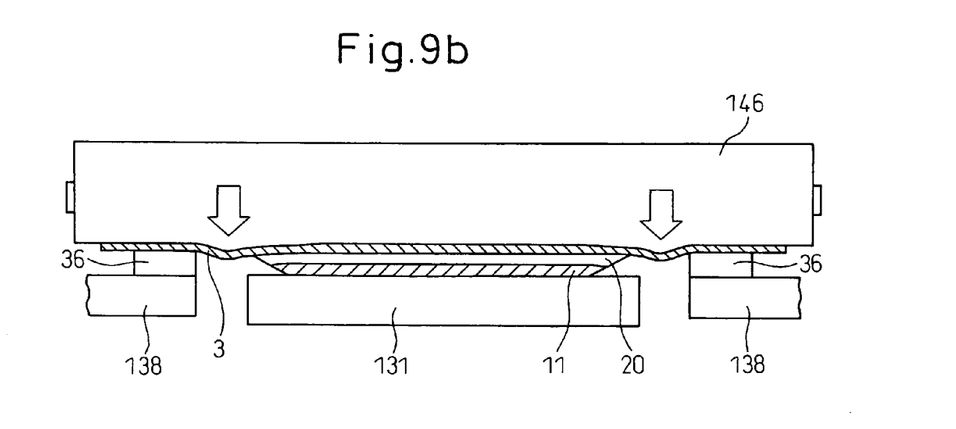
FIG. 9b is a sectional view as taken along the attaching roll shown by the solid line in FIG. 8.

FIGS. 9a and 9b are sectional views taken along the attaching roll 146 and shown by the dotted line and the solid line, respectively. Specifically, FIG. 9a shows the state in which the dicing tape 3 begins to be attached at the end portion 28 of the wafer 20. FIG. 9b, on the other hand, shows the state in which the dicing tape is attached to about central portion of the wafer 20. As can be understood from these drawings, the wafer 20 and the mount frame 36 are supported on tables 131, 138, respectively.

As can be understood by reference to FIG. 7, the thickness of the wafer 20 is reduced by back grinding and, therefore, the end portion 28 of the wafer 20 after back grinding corresponds to the chamfered portion 26. At the time of starting to attach the dicing tape 3 as shown in FIG. 9a, therefore, a force is exerted in the direction of arrow in such a way that the central portion, or thereabouts, of the attaching roll 146 is deformed and the chamfered portion 26 of the wafer 20 lacking a surface protective film 11 is pressed. Also, immediately before the end of the process of attaching the dicing tape 3, a similar force is exerted at the end portion 29 opposite of the end portion 28.

Also, at about the central portion of the wafer 20, as shown in FIG. 9b, the attaching roll 146 is deformed at the edges of the wafer 20, and the ends of the wafer 20 perpendicular to the moving direction the attaching roll 146 are curved downward. This force may form cuts or cracks at the ends of the wafer 20, so that the yield of the products is reduced. Even in the case where cuts or cracks do not occur, internal distortions of the wafer is caused and may appear as cuts or cracks in the subsequent processes.

This invention has been achieved in view of this situation, and the object thereof is to provide a dicing tape attaching method in which the dicing tape can be attached on the mount frame and the wafer without forming cuts or cracks or internal distortions of the wafer, and a dicing tape attaching apparatus for carrying out the method.

SUMMARY OF THE INVENTION

In order to achieve the object described above, according to a first aspect of the invention, there is provided a dicing tape attaching apparatus for attaching a dicing tape on a mount frame and a wafer, comprising a fixed table for supporting the mount frame, a movable table for supporting the wafer, a height adjusting means for adjusting the height of the movable table, and a dicing tape attaching means to move in parallel to the dicing tape attaching surface of the wafer for attaching the dicing tape on the mount frame and the wafer, wherein when the dicing tape is attached on the mount frame and the wafer, the height adjusting means coincides the height of the dicing tape attaching surface of the wafer supported on the movable table with the height of the upper surface of the mount frame supported on the fixed table.

Specifically, in the first aspect, at the time of attaching the dicing tape, the wafer on the movable table and the mount frame on the fixed table can be made flush with each other by the height adjusting means. Thus, an unnecessary force, from the dicing tape attaching means, is not exerted on the edges of the wafer. As a result, the dicing tape can be attached on the mount frame and the wafer without forming cuts, cracks and internal distortions in the wafer.

According to a second aspect of the invention, there is provided a dicing tape attaching apparatus in the first aspect, wherein the height adjusting means is a screw jack.

Specifically, in the second aspect, the use of the screw jack prevents the position of the movable table from being changed by the force exerted at the time of attaching the dicing tape.

According to a third aspect of the invention, there is provided a dicing tape attaching apparatus in the first or second aspect, wherein the dicing tape attaching surface of the wafer is formed by grinding the back surface of the wafer.

Specifically, in the third aspect, even in the case where the wafer is back ground and the ground back surface reaches the chamfered portion of the front surface, the wafer is prevented from forming cuts or cracks and internal distortions. The thickness of the back ground wafer may be not more than, for example, 100 micrometers.

According to a fourth aspect of the invention, there is provided a dicing tape attaching apparatus in any one of the first to third aspects, further comprising a height detection means for detecting the height of the dicing tape attaching surface of the wafer supported on the movable table and/or the height of the upper surface of the mount frame supported on the fixed table, wherein the height adjusting means adjusts the height of the movable table based on the height of the dicing tape attaching surface and/or the height of the upper surface of the mount frame detected by the height detection means.

Specifically, in the fourth aspect, the height of the movable table can be automatically adjusted based on the height of the dicing tape attaching surface and/or the height of the upper surface of the mount frame.

According to a fifth aspect of the invention, there is provided a dicing tape attaching apparatus in any one of the first to fourth aspects, further comprising an input means for inputting the thickness of the wafer, the thickness of the film attached on the surface of the wafer opposite to the dicing tape attaching surface of the wafer and/or the thickness of the mount frame, wherein the height adjusting means adjusts the height of the movable table based on the thickness of the wafer and the film and/or the thickness of the mount frame input by the input means.

Specifically, in the fifth aspect, the height of the movable table can be accurately adjusted in accordance with the degree to which the wafer is back ground and/or the thickness of the used surface protective film.

According to a sixth aspect of the invention, there is provided a dicing tape attaching apparatus in any one of the first to fifth aspects, further comprising a pressing means for applying the pressing force by pressing the dicing tape attaching surface of the wafer supported on the movable table against the dicing tape attaching means through the dicing tape, a dicing tape attaching means distance calculation means for detecting the distance covered by the dicing tape attaching means when the dicing tape attaching means is moved from one end of the wafer in parallel to the dicing tape attaching surface of the wafer, and a movable table pressing force setting means for setting the pressing force of the movable table using the covered distance of the dicing tape attaching means detected by the dicing tape attaching means distance calculation means in such a manner that the pressure applied at the contact point of the wafer to the dicing tape is kept substantially constant during the movement of the dicing tape attaching means from one end to the other end of the wafer.

Specifically, in the sixth aspect, the pressing force of the movable table is set in accordance with the covered distance of the tape attaching means calculated by the tape attaching means distance calculation means and, therefore, the surface pressure applied to the wafer can be substantially accurately equalized over the whole wafer. As a result, an unnecessary force from the dicing tape attaching means is not exerted over the whole outer periphery of the wafer. Thus, cuts, cracks and internal distortions can be further prevented. The surface pressure is defined as the pressure exerted on the wafer per unit area thereof.

According to a seventh aspect of the invention, there is provided a dicing tape attaching apparatus in the sixth aspect, wherein the pressing means is an air cylinder and includes a stopper adapted to stop the rod of the air cylinder before the stroke end thereof.

Specifically, in the seventh aspect, the movable table can be held before the stroke end of the movable table and therefore can be smoothly moved.

According to an eighth aspect of the invention, there is provided a dicing tape attaching apparatus in the sixth or seventh aspect, wherein the dicing tape attaching means is a roll, and at least a part of the roll is formed of a material not substantially deformed when the pressing force is applied by the pressing means.

Specifically, in the eighth aspect, the roll is not substantially deformed, and therefore an unnecessary force is not exerted especially on the edges of the wafer. The hardness of the roll rubber is desirably about 40 to 45 degrees. Also, the diameter of the roll can be increased as much as possible.

According to a ninth aspect of the invention, there is provided a dicing tape attaching method, for attaching a dicing tape on a mount frame and a wafer, comprising the steps of supporting the mount frame on the fixed table, supporting the wafer on the movable table, adjusting the height of the movable table in such a manner that the height of the dicing tape attaching surface of the wafer supported on the movable table coincides with the height of the upper surface of the mount frame supported on the fixed table when the dicing tape is attached on the mount frame and the wafer, and moving a dicing tape attaching means in parallel to the dicing tape attaching surface of the wafer thereby to attach the dicing tape on the mount frame and the wafer.

Specifically, in the ninth aspect, the wafer on the movable table and the mount frame on the fixed table can be arranged flush with each other by the height adjusting means at the time of attaching the dicing tape. As a result, the unnecessary force from the dicing tape attaching means is prevented from being exerted on the edges of the wafer. As a result, the dicing tape can be attached on the mount frame and the wafer without forming cuts or cracks and internal distortions in the wafer.

According to a tenth aspect of the invention, there is provided a dicing tape attaching method in the ninth aspect, further comprising the steps of detecting the height of the dicing tape attaching surface of the wafer supported on the movable table and/or the height of the upper surface of the mount frame supported on the fixed table and adjusting the height of the movable table based on the detected height of the dicing tape attaching surface and/or the detected upper surface of the mount frame.

Specifically, in the tenth aspect, the height of the movable table can be automatically adjusted based on the height of the dicing tape attaching surface and/or the height of the upper surface of the mount frame.

According to an 11th aspect of the invention, there is provided a dicing tape attaching method in the ninth or tenth aspect, further comprising the steps of inputting the thickness of the wafer, the thickness of the film attached on the surface opposite to the dicing tape attaching surface and/or the thickness of the mount frame and adjusting the height of the movable table based on the input thickness of the wafer and the film and/or the input thickness of the mount frame.

Specifically, in the 11th aspect, the height of the movable table can be accurately adjusted in accordance with the degree to which the wafer is back ground and/or the thickness of the used surface protective film.

According to a 12th aspect of the invention, there is provided a dicing tape attaching method in any one of the ninth to 11th aspects, further comprising the steps of supplying the dicing tape between the dicing tape attaching surface of the wafer and the dicing tape attaching means by a dicing tape supply means moving the movable table toward the dicing tape attaching means so as to exert the pressing force to the dicing tape attaching surface of the wafer supported on the movable table against the dicing tape attaching means through the dicing tape calculating the distance covered by the dicing tape attaching means from one end of the wafer and setting the pressing force of the movable table using the covered distance of the dicing tape attaching means detected by the dicing tape attaching means distance calculation means in such a manner that the pressure at the contact point of the wafer to the dicing tape is kept substantially constant during the movement of the dicing tape attaching means moves from one end to the other end of the wafer.

Specifically, in the 12th aspect, the pressing force of the movable table is set in accordance with the covered distance of the dicing tape attaching means as calculated and, therefore, the surface pressure applied to the wafer is kept substantially and accurately equal over the whole wafer. As a result, the unnecessary force from the dicing tape attaching means is prevented from being exerted over the whole outer periphery of the wafer, thereby preventing the forming of cuts, cracks and internal distortions.

These and other objects, features and advantages of the present invention will be more apparent in light of the detailed description of exemplary embodiments thereof as illustrated by the drawings.

DETAILED DESCRIPTION OF THE INVENTION

Embodiments of the invention are explained below with reference to the accompanying drawings. In the drawings, the same component members are designated by the same reference numerals, respectively. To facilitate the understanding, the scale of the drawings has been appropriately changed.

Figure 1:
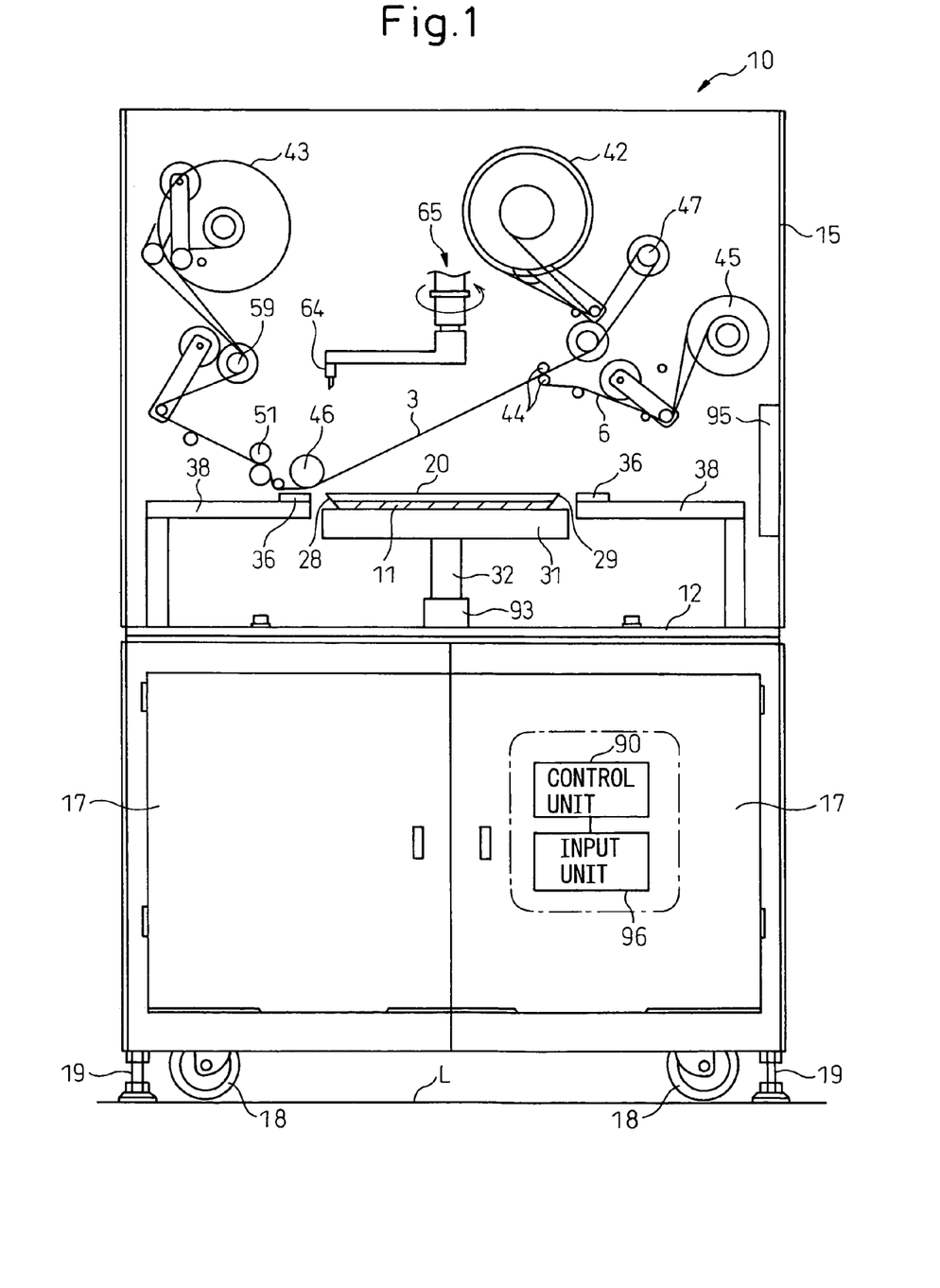
FIG. 1 is a sectional view schematically showing a dicing tape attaching apparatus according to the invention.

FIG. 1 is a sectional view schematically showing a dicing tape attaching apparatus according to this invention. The back surface of a wafer 20 supplied to a dicing tape attaching apparatus 10, as explained with reference to FIG. 7, is ground by back grinding to a chamfered portion 26 on the front surface thereof, and the thickness of the wafer 20 is not more than 100 micrometers. Also, as is well known, a surface protective film 11 for protecting the semiconductor elements is already attached on the front surface of the wafer 20.

The dicing tape attaching apparatus 10 shown in FIG. 1 includes a housing 15 containing therein a supply unit 42 for supplying a dicing tape 3 to be attached on a circular silicon wafer 20 and a take-up unit 43 for taking up the tape from the supply unit 42. As shown in FIG. 1, a plurality of castors 18 and a plurality of stoppers 19 are arranged on the bottom surface of the housing 15. The dicing tape attaching apparatus 10 is moved to the desired position on a floor L by the castors 18 and can be fixed at the desired position by the stoppers 19. Also, doors 17 are arranged in the lower part of the dicing tape attaching apparatus 10. By opening the doors 17, a control unit 9 such as a digital computer and other members described later, arranged in the lower part of the dicing tape attaching apparatus 10, can be accessed.

As shown in FIG. 1, a guide roll 47 for guiding the dicing tape 3 and applying a predetermined tension to the dicing tape 3 is arranged downstream of the supply unit 42. Further, a pair of peeling rolls 44 are arranged downstream of the guide roll 47. The peeling rolls 44 function to peel a release 6 of the dicing tape 3, so that the release 6 is taken up on the a release take-up unit 45. Guide rolls 51 for guiding the dicing tape 3 and a take-up unit 43 for taking up the dicing tape 3 are arranged downstream of the peeling rolls 44. Also, a dancer roll 59 adapted to move in accordance with the amount of the supplied dicing tape 3 is arranged between the guide rolls 51 and the take-up unit 43.

As shown in FIG. 1, on a rack 12 arranged in the intermediate portion of the dicing tape attaching apparatus 10 a movable table 31 adapted to move up and down is arranged. The wafer 20 is supported on the movable table 31 with the front surface 21 on which a surface protective film 11 is attached, down, i.e. with a back ground surface 22 up.

Further, a fixed table 38 having an opening corresponding to the outer periphery of the movable table 31 is arranged around the movable table 31. The wafer 20 and the movable table 31 are adapted to move up and down through the opening of the fixed table 38. As shown in FIG. 1, a mount frame 36 is arranged on the upper surface around the opening of the fixed table 38. The mount frame 36 functions to hold each of parts of wafer 20 which are cut in the dicing process. The wafer 20 and the mount frame 36 are supported by well-known means such as vacuum adsorption on the movable table 31 and the fixed table 38, respectively.

Figure 2:
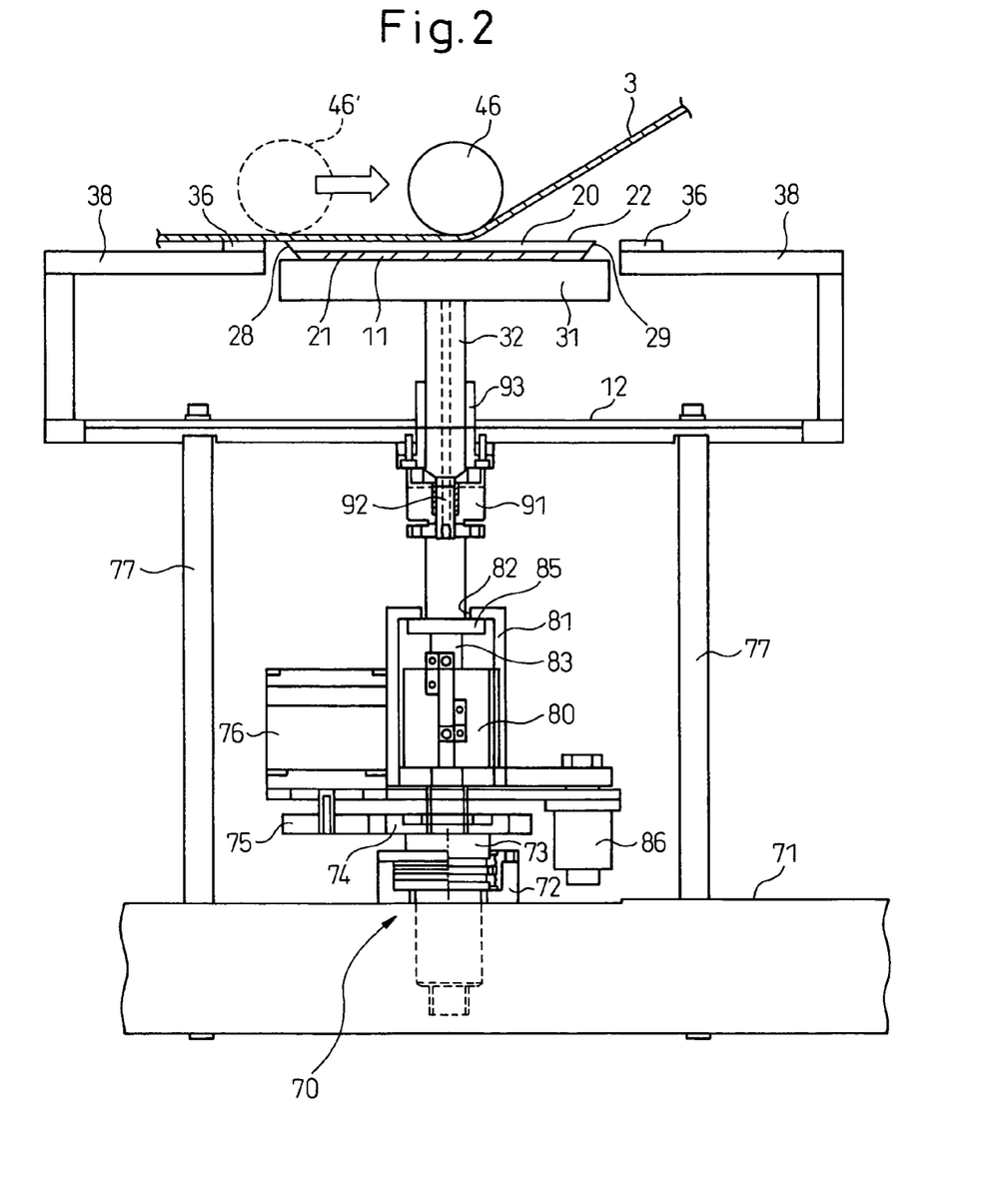
FIG. 2 is a partly enlarged view of the dicing tape attaching apparatus.

FIG. 2 is an partially enlarged view showing a part of the dicing tape attaching apparatus in enlarged form. Poles 77 extending downward from the rack 12 are connected to a base 71 of the housing 15. A shaft 32 extending from the bottom surface of the movable table 31 is guided by a guide 93 arranged on the rack 12, and the forward end of the shaft 32 is formed as a spline shaft 92. An outer side portion 91 formed with a groove for engaging with the spline shaft 92 is connected to the forward end of a rod 83 of an air cylinder 80. As a result, the shaft 32 having the spline shaft 92 can be accurately slid in vertical direction along the outer side portion 91.

The rod 83 moved up and down by the operation of the air cylinder 80 extends through a hole 82 formed in the upper surface of an air cylinder casing 81. As shown in FIG. 2, a flange 85 is fixed midway of the rod 83. The diameter of the flange 85 is larger than the hole 82 of the air cylinder casing 81, and the flange 85 functions as a stopper to restrict the movement of the rod 83. Though not shown, the rod 83 is connected to the piston in the air cylinder 80. Further, the air cylinder 80 is driven by a motor 86.

A gear 74 is arranged on the lower surface of the air cylinder casing 81. This gear 74 is engaged with another gear 75 driven by the motor 76. Also, the gear 74 is integrated with the threaded shaft 73 of a screw jack 70. The threaded shaft 73 is engaged with a female screw 72 arranged on a base 71. Upon rotation of the gear 75 by the motor 76 driven, the threaded shaft 73 rotates through the gear 74, so that the air cylinder 80 and the movable table 31 located above the gear 74 are moved up and down integrally. In other words, the screw jack 70 functions as a height adjusting means for adjusting the height of the movable table 31.

A motor 76 may be arranged under the screw jack 70 to drive the screw jack 70. Also, the screw jack motor 76 and the air cylinder motor 86 are connected to a control unit 90.

As shown in FIG. 2, a roll 46 adapted to reciprocate horizontally in the housing 15 is arranged on the movable table 31. The length of the roll 46 is larger than the maximum width of the wafer 20 and the mount frame 36 (see the roll 146 shown in FIG. 8). Though not shown, the roll 46 is connected to an endless chain suspended on two pulleys, which in turn are connected to a motor not shown. By driving the motor in forward and backward directions, the roll 46 can be reciprocated horizontally between the pulleys.

The roll 46 may, of course, be reciprocated horizontally by another drive mechanism. As can be understood from FIG. 2, the dicing tape 3 is supplied between the roll 46 and the wafer 20 and the mount frame 36. Then, the roll 46 moves horizontally from the end of the mount frame 36 near the end 28 of the wafer 20 to the end of the mount frame 36 near the other end 29 of the wafer through the diameter of the wafer 20, so that the dicing tape 3 can be attached on the wafer 20 and the mount frame 36.

Also, the whole of the roll 46 may be formed of a rubber material or the peripheral surface of the roll 46 may be covered with a rubber material. The roll 46 used in the dicing tape attaching apparatus 10 according to this invention is formed of a material hardly deformed under the pressing force exerted thereon as described later. A rubber material having the rubber hardness of about 40 to 45 may be used.

Referring again to FIG. 1, a cutter unit 65 is arranged above the movable table 31 and the roll 46. The cutter unit 65 has a rotatable cutter 64 adapted to reciprocate vertically. After attaching the dicing tape, the cutter unit 65 is moved to the wafer 20, and then the cutter 64 is rotated along the peripheral edge of the mount frame 36. In this way, the dicing tape 3 attached on the wafer 20 and the mount frame 36 can be cut.

Further, a height detector 95 is arranged in the housing 15. The height detector 95 detects at least one of the height of the grinding back surface 22 of the wafer 20 supported on the movable table 31 and the height of the upper surface of the mount frame 36 supported on the fixed table 38. This height detector 95 is connected to the control unit 90.

An input unit 96 such as a keyboard or a mouse is also connected to the control unit 90. The operator can appropriately input the thickness of the wafer 20 after being back ground and/or the thickness of the surface protective film 11 from the input unit 96.

During the operation of the dicing tape attaching apparatus 10 according to the invention, as described above, the wafer 20 and the mount frame 36 are supported on the movable table 31 and the fixed table 38, respectively. Then, the height of the grinding surface 22 of the wafer 20 supported on the movable table 31 and the height of the upper surface of the mount frame 36 supported on the fixed table 38 are detected by the height detector 95. The height of the wafer 20 and the mount frame 36 thus detected are supplied to the control unit 90, which in turn drives the screw jack 70 through the motor 76 based on the detected heights.

As a result, the threaded shaft 73 of the screw jack 70 is appropriately rotated, and the movable table 31 moves up and down integrally with the gear 74, the air cylinder 80 and the shaft 32 thereby to adjust the height of the movable table 31. Thus, the height of the grinding surface 22 of the wafer 20 comes to coincide with the height of the upper surface of the mount frame 36 (see FIG. 2). In the case where one of the height of the wafer 20 and the mount frame 36 is known, the operation of detecting the height thereof may be omitted.

The degree to which the wafer 20 is back ground and/or the thickness of the surface protective film 11 may be varied from one wafer 20 or lot to another. In such a case, the thickness of the wafer 20 ground and/or the thickness of the surface protective film 11 is input using the input unit 96. The control unit 90, taking the input value into consideration, drives the screw jack 70 so that the height of the grinding surface 22 of the wafer 20 and the height of the upper surface of the mount frame 36 coincide with each other. In other words, even in the case where the degree to which the wafer 20 is back ground and/or the thickness of the surface protective film 11 is varied, the height of the movable table 31 is accurately adjusted to the height of the upper surface of the mount frame 36.

In FIG. 2, an initial position 46' of the roll 46 for attaching the dicing tape 3 is shown. As shown in FIG. 2, the roll 46 at the initial position 46' is located substantially just above the end portion 28 of the wafer 20. At this time, the dicing tape 3 is partially attached under a predetermined pressing force against the mount frame in the neighborhood of the end portion 28. The grinding surface 22 of the wafer 20 and the upper surface of the mount frame 36 are substantially flush with each other, and therefore the opposite ends of the roll 46 are placed on the mount frame 36 at the initial position 46'. As a result, an unnecessary force, from the roll 46, is not exerted on the grinding surface 22 of the wafer 20. Therefore, cuts, cracks or internal distortions are not formed under the pressure applied to the wafer 20 by the force from the roll 46. Also, according to this invention, the roll 46 is formed of a material which is hardly deformed, and therefore cuts or cracks can be further prevented.

Figure 6:
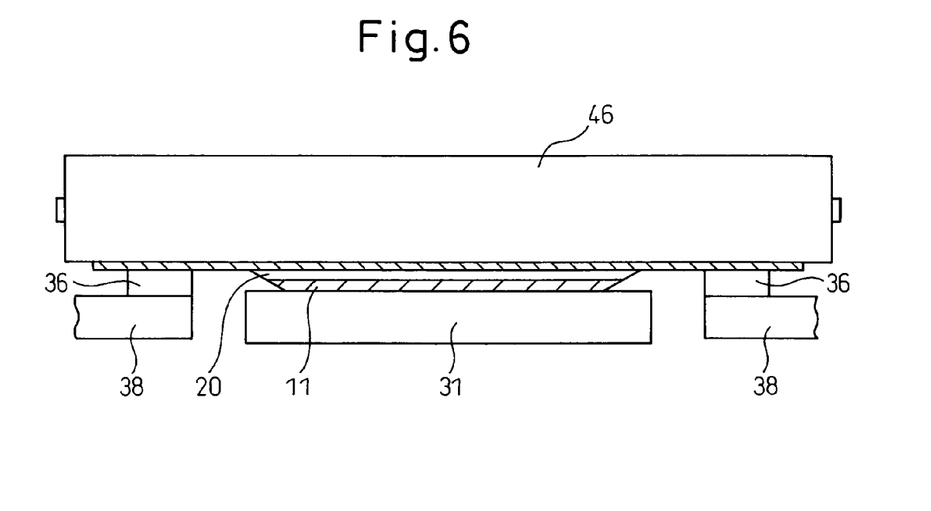
FIG. 6 is a sectional view of the attaching roll moving at about the central portion of the wafer.

Also, at the time of attaching the dicing tape 3 by the dicing tape attaching apparatus 10, the roll 46 moves diametrically from the end portion 28 of the wafer 20 toward the end portion of the mount frame 36 near the end portion 29. While the roll 46 moves in the neighborhood of the central portion of the wafer 20, the ends of the roll 46 remain supported on the mount frame 36 as shown in FIG. 6. Therefore, the roll 46 is not deformed at the edges of the wafer 20 perpendicular to the direction of movement of the roll 46. Thus, cuts, cracks or the like are not formed in the wafer 20.

When the roll 46 is moved on the wafer 20 to attach the dicing tape 3, the appropriate pressing force is generated between the movable table 31 and the roll 46 by the air cylinder 80.

Figure 3:
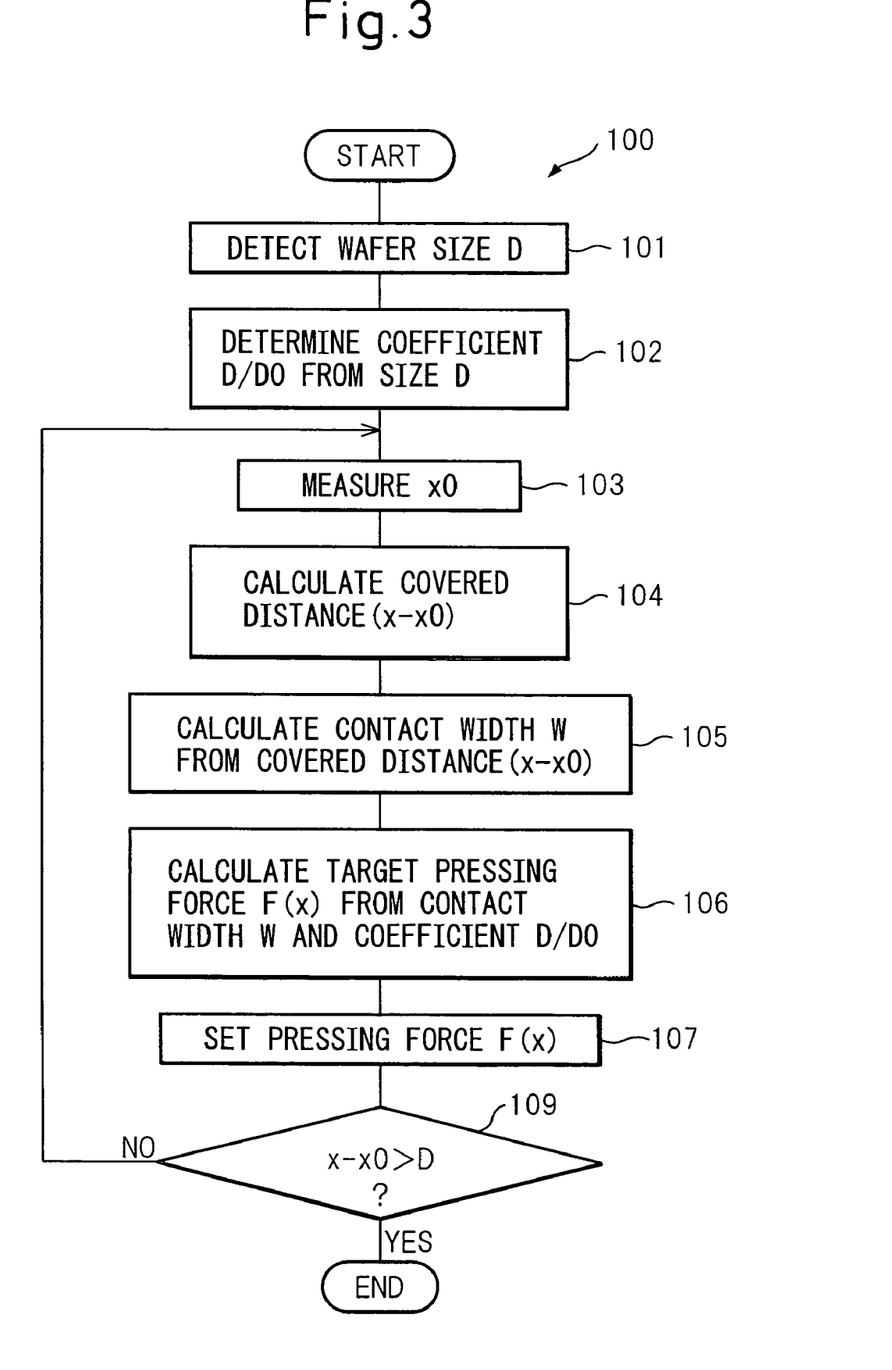
FIG. 3 is a flowchart for a first operation program of the tape attaching apparatus according to the invention.

FIG. 3 is a flowchart showing the operation program for the tape attaching apparatus according to the invention. The program 100 shown in FIG. 3 is stored in a storage unit such as a ROM or a RAM of the control unit 90 and is executed by the control unit 90. This program 100 is executed at the same time that the roll 46 (designated by dotted line as a reference numeral 46' in FIG. 2) at a position corresponding to the end portion 28 of the wafer 20 begins to move in the direction of arrow (diametrical direction) along the tape attaching surface 20' of the wafer 20.

In step 101 of the program 100 shown in FIG. 3, the size D such as the diameter of the used wafer 20 is detected. The size of the wafer 20 is detected by a sensor (not shown) arranged diametrically or concentrically on the table 31. As an alternative, in step 101, the operator of the dicing tape attaching apparatus 10 may directly input the size D of the wafer 20 from the input unit 96 of the control unit 90.

Next, in step 102, the ratio of the size D of the wafer 20 to a predetermined size D0, i.e. the coefficient D/D0 is determined. The predetermined size D0 may be the maximum size of the wafer 20 that can be supported on the table 31 of the dicing tape attaching apparatus 10. Then, the process proceeds to step 103 in which the distance x0 from an origin 0 (see FIG. 4 described later) at a certain position to an end 28 of the wafer 20 is measured using an encoder or the like not shown. The end 28 of the wafer 20 located at a position the distance x0 from the origin 0 is set as a measurement starting point 00.

Next, in step 104, the distance (x−x0) covered by the roll 46 from the measurement starting point 00 is calculated. As can be understood from FIG. 4 described later, the covered distance (x−x0) is the distance covered by the roll 46 on the wafer 20. The measurement starting point 00 coincides with the end 28 of the wafer 20 for each size. During the movement of the roll 46 in one direction from the end 28 to the other end 29 of the wafer 20, the distance (x−x0) covered by the roll 46 is calculated from the speed of the motor coupled to the pulley described above relating to the roll 46.

Figure 4:
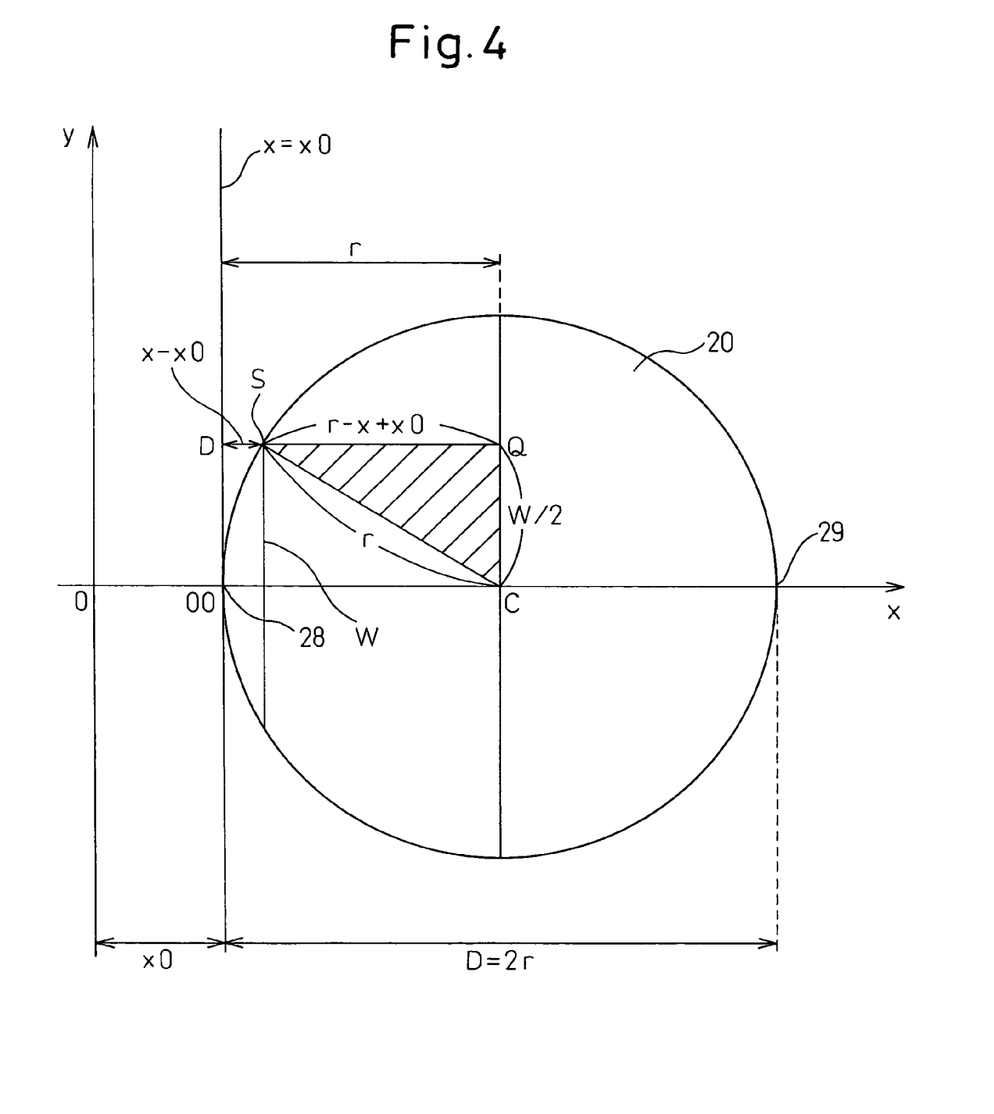
FIG. 4 is a diagram for explaining the contact width W.

Next, using the distance (x−x0) covered by the roll 46, the contact width W, in which the wafer 20 contacts with the roll 46 via the dicing tape 3, is calculated in step 105. FIG. 4 is a diagram for explaining the contact width W. In FIG. 4, the wafer 20 is viewed from above. In FIG. 4, the end 28 of the wafer 20 is the measurement starting point 00, and the y axis extending horizontally crosses at right angles to the x axis at the origin 0. As shown in FIG. 4, the center C of the circular wafer 20 is located on the x axis. The wafer 20 is in line contact with the roll 46 in the direction parallel to the y axis. In this specification, this line contact area is called the contact width W. In the embodiments shown in the accompanying drawings, the origin 0 is located outside of the wafer 20. In the case where the wafer 20 of maximum size is used, however, the end 28 of the wafer 20 may be the origin 0. In this case, the origin 0 and the measurement starting point 00 are equal to each other and therefore x0=0.

The contact width W, in which the wafer 20 contacts with the roll 46, when the roll 46 is advanced by the distance (x−x0) is determined in the manner described below. In FIG. 4, if the contact width W crosses the peripheral edge of the wafer 20 at a crossing point S and if the line extending in parallel to the x axis through the crossing point S crosses the line perpendicular to the x axis through the center C of the wafer 20 at a crossing point Q and if the line extending in parallel to the x axis through the crossing point S crosses the line of x=x0 at a crossing point D, as shown in FIG. 4, the line segment SC is equal to the radius r of the wafer 20. Also, the wafer 20 is symmetric about the x axis, and therefore the line segment QC is equal to one half of the contact width W. Further, the line segment DQ is equal to the line segment 00-C (=r) on the x axis, and the line segment DS is equal to the distance (x−x0). Therefore, the line segment SQ is equal to r−x+x0. As a result, taking note of the triangle SQC shown in FIG. 4, the contact width W is expressed by the equation below.

$$W=2\sqrt{r^2-(r-x+x0)^2} \quad (1)$$

Figure 5A:
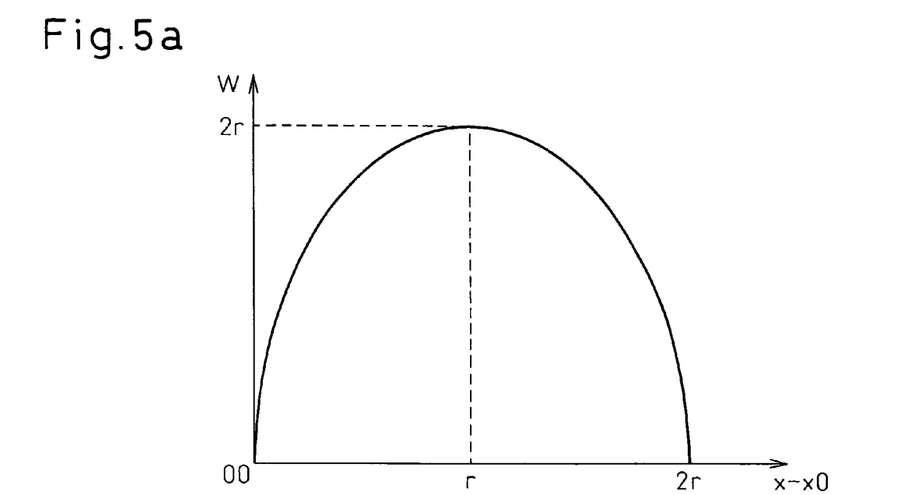
FIG. 5a is a diagram showing the relation between the distance (x−x0) covered by the attaching roll and the contact width W between the wafer and the attaching roll through the tape.

The behavior of the contact width W at the time of movement of the roll 46 will be explained. FIG. 5a is a diagram showing the relation between the distance (x−x0) covered by the roll 46 from the measurement starting point 00 and the contact width W of the wafer 20 with the roll 46 through the dicing tape 3. In FIG. 5a, the abscissa represents the distance (x−x0) covered by the roll 46 from the measurement starting point 00, and the ordinate represents the contact width W described above. As shown in FIG. 5a, at the initial position where the center of the roll 46 corresponds to the end 28 of the wafer 20 (see the roll 46' shown by dotted line in FIG. 2), the contact width W is substantially zero and the roll 46 and the end 28 of the wafer 20 are in point contact with each other. With the increase in the covered distance x, the contact width W increases in accordance with the equation described above, and when the covered distance x coincides with the radius r of the wafer 20, the contact width W assumes the maximum value 2r (=D). After that, the contact width W gradually decreases and, when the covered distance x is 2r, the contact width W becomes substantially zero again. According to this embodiment, a circular wafer 20 is used and therefore the contact width W behaves symmetrically about a line associated with the covered distance x equal to the radius r.

Referring again to FIG. 3, in step 106, the target value of the pressing force F(x), under which the wafer 20 is pressed against the roll 46 through the dicing tape 3 by the table 31, is calculated from the coefficient D/D0 calculated in step 102 and the contact width W calculated in step 105. The target pressing force F(x) is calculated on the basis of a predetermined pressing force F0. The predetermined pressing force F0 is the maximum value of the force exerted on the wafer 20 when the wafer 20 of the maximum size installable on the table 3 is supported on the table 31 of the table lift 30 and the distance (x−x0) covered by the roll 46 corresponds to the radius r, i.e. the axis of the roll 46 is located at the center of the wafer 20. When the distance (x−x0) covered by the roll 46 reaches the radius r, the contact width W is equal to the diameter D (=2r) of the wafer 20. This contact width W may correspond to the contact area A of the portion of the wafer 20 in contact with the roll 46 through the dicing tape 3.

The contact between the wafer 20 and the roll 46 through the dicing tape 3 is not a line contact and, strictly speaking, the contact is a surface contact with a minor distance along x direction. Thus, the contact area A can be calculated more accurately by multiplying the coefficient corresponding to this minor distance by the contact width W.

Figure 5B:
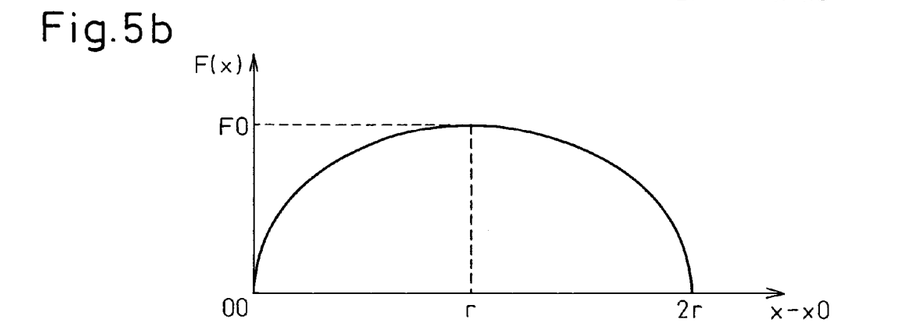
FIG. 5b is a diagram showing the relation between the distance (x−x0) covered by the attaching roll and the pressing force F(x).
Figure 5C:
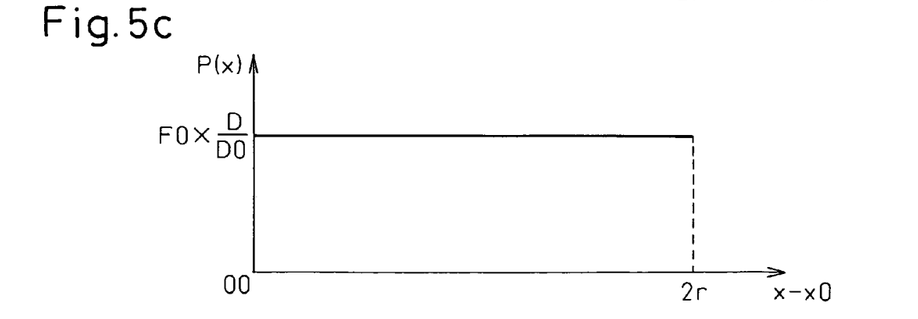
FIG. 5c is a diagram showing the relation between the distance (x−x0) covered by the attaching roll and the pressure P(x).

According to this invention, the pressing force F(x) under which the wafer 20 is in contact with the roll 46 is determined in such a manner that the pressure P(x) exerted on the contact area A is constant. FIG. 5b is a diagram showing the relation between the distance (x−x0) covered by the roll 46 and the pressing force F(x), and FIG. 5c a diagram showing the relation between the distance (x−x0) covered by the roll 46 and the pressure P(x). In these drawings, the abscissa represents the covered distance (x−x0), and the ordinate represents the pressing force F(x) and the pressure P(x), respectively. As shown in FIG. 5c, in order that the pressure P(x) may be constant during the movement of the roll 46 on the wafer 20 (0≦x−x0≦2r), the pressing force F(x) is required to be increased with the increase in the contact width W or the contact area A when the covered distance (x−x0) is smaller than the radius r (0≦x−x0<r), while the pressing force F(x) is required to be decreased with the decrease in the contact width W when the covered distance (x−x0) is not less than the radius r and not more than twice the radius r (r≦x−x0 ≦2r). Taking into the consideration the fact that pressure is a force exerted on the unit area, the pressing force F(x) according to the invention is expressed by equation below (see also FIG. 5b).

$$F(x)=F0 \times W \times D/D0=(2F0 \cdot D/D0)\sqrt{r^2-(r-x+x0)^2} \quad (2)$$

By applying this pressing force F(x) to the wafer 20, the pressure P(x) remains at a constant value (=F0·D/D0) regardless of the distance (x−x0) covered by the roll 46 during the movement of the roll 46 from one end 28 to the other end 29 of the wafer 20.

In this equation, the coefficient D/D0 is multiplied in order to exert the pressing force F(x) corresponding to the size of the wafer 20 on the wafer 20. Specifically, the pressing force F(x) exerted on the wafer 20 having the size D is always D/D0 times smaller than the force exerted on the wafer 20 of maximum size D0. In the case where the dicing tape 3 is attached on a plurality of wafers 20 of various sizes by the same tape attaching apparatus, the initial setting such as the maximum pressing force is required to be changed in accordance with the size of the wafer 20. According to the invention, however, the pressing force F(x) is calculated after multiplying the coefficient D/D0, and therefore, even in the case where the dicing tape 3 is attached on the wafer 20 of a different size, the initial setting is not required to be changed in accordance with the size of the wafer 20. As a result, the dicing tape 3 can be continuously attached on the wafer 20 without work suspension. The value of the pressure P can of course be changed by multiplying F0 by a predetermined value.

As an alternative, coefficients are predetermined in accordance with the hardness, thickness and adhesive temperature of the bonding agent used with the dicing tape 3 and stored in the storage unit of the control unit 90, and the target pressing force F(x) may be calculated by appropriately multiplying these coefficients. In this case, the target pressing force F(x) can be calculated with higher accuracy.

The process then proceeds to step 107, in which the air cylinder 80 of the table lift 30 is adjusted through the control unit 90 in such a manner that the pressing force F(x) corresponding to the covered distance (x−x0) can be exerted on the wafer 20 by the table 31. The force exerted on the air cylinder 80 is varied with the value of the target pressing force F(x) and the type of the dicing tape 3 used. For this reason, the force exerted on the air cylinder 80 is determined experimentally, and stored in the form of a map, as a function of the target pressing force F(x) and the type of the dicing tape 3, in a storage unit such as a ROM or a RAM of the control unit 90. In step 107, the force exerted on the air cylinder 80 is determined from this map, thereby making it possible for the table 31 to exert the pressing force F(x) on the wafer 20.

As will be understood from the relation between the pressing force F(x) and the covered distance (x−x0) shown in FIG. 5b, the pressing force F(x) exerted on the wafer 20 increases when the covered distance (x−x0) is between zero and the radius r ($0 \leq x-x0 < r$), while the pressing force F(x) exerted on the wafer 20 is decreased when the covered distance (x−x0) is between the radius r and twice the radius r ($r \leq x-x0 \leq 2r$) (see Equation (2)). In this way, the pressing force F(x) is adjusted to remain a constant value of the pressure P(x) regardless of the distance (x−x0) covered by the roll 46. Specifically, according to the invention, the pressing force F(x) of the table 31 is adjusted to remain a constant pressure exerted on the contact portion of the wafer 20 taking the change of the contact width W with the covered distance (x−x0) into consideration.

Next, in step 109, it is determined whether the distance (x−x0) covered by the roll 46 calculated in step 104 is larger than the diameter D, i.e. twice the radius r of the wafer 20 or not. In the case where the covered distance (x−x0) is not larger than or equal to the diameter D, the process proceeds to step 103, the process is repeated. In the case where it is determined that the covered distance (x−x0) is larger than the diameter D, on the other hand, it can be determined that the roll 46 has passed the other end 29 of the wafer 20, and therefore the dicing tape 3 is attached with a predetermined pressing force up to the end of the mount frame near the end portion 29, after which the process is ended. After that, a cutter unit 65 is rotated so that the dicing tape 3 attached on the wafer 20 and the mount frame 36 is appropriately cut off along the periphery of the mount frame 36.

In this way, a substantially equal pressure can be exerted over the whole wafer 20 by the dicing tape attaching apparatus 10 in the present invention. Specifically, according to this invention, the pressing force is adjusted so that the neighborhood of the end portions 28, 29 of the wafer 20 may not be locally pressed. In the present invention, the surface pressure, i.e. the pressure per unit area of the wafer is substantially equal over the whole wafer. Due to the foregoing, an unnecessary force from the roll 46 is not exerted on the end portions 28, 29 and the outer peripheral portion of the wafer 20, thereby making it possible to further prevent cuts, cracks or internal distortions from being generated.

Further, according to the prior art in which the pressing force is exerted using an air cylinder 80, the movable table 31 and the air cylinder 80 may be pushed back by the repulsive force of the roll 46. According to the invention, however, the use of the screw jack 70 prevents the movable table 31 and the air cylinder 80 from being pushed back by the repulsive force even when the repulsive force is generated from the roll 46. In other words, the use of the screw jack 70 prevents the position of the movable table 31 from being changed when attaching the dicing tape 3.

As described above, the flange 85 is arranged midway of the rod 83 of the air cylinder 80. This flange 85 engages the outer peripheral portion of the hole 82 of the air cylinder casing 81 and restricts the extension of the rod 83 to the maximum stroke thereof. Thus, the rod 83 extends only to the point where the flange 85 engages the outer peripheral portion of the hole 82.

In the case where the attaching operation is performed with the air cylinder rod extended to the neighborhood of the maximum stroke thereof as in the prior art, the large sliding resistance and the variation thereof occurring during the operation of the air cylinder makes it difficult to move the movable table 31 smoothly from the position of maximum stroke during the attaching process. According to this invention, on the other hand, the fact that the extension of the rod 83 is restricted by the flange 85 makes it possible to slide the movable table 31 smoothly when attaching the dicing tape 3, with the result that the dicing tape can be attached in stable fashion. Specifically, according to this invention, it is apparent that the flange 85 is arranged at a position where the sliding resistance and the variation thereof when operating the air cylinder are comparatively small.

Depending on the material used form the roll 46, the grinding surface 22 of the wafer 20 and the upper surface of the mount frame 36 are not necessarily flush with each other. In the case where the roll 46 is formed of rubber liable to be deformed with comparative ease, for example, the grinding surface 22 of the wafer 20 is desirably set slightly lower than the upper surface of the mount frame 36. This configuration for attaching the dicing tape 3 with the height of the grinding surface 22 and the height of the upper surface of the mount frame 36 displaced from each other by a predetermined distance as described above is also included in the scope of the invention.

Although the invention has been shown and described with exemplary embodiments thereof, it should be understood, by those skilled in the art, that the foregoing and various other changes, omissions and additions may be made therein and thereto without departing from the scope of the invention.

The invention claimed is:

1. A dicing tape attaching apparatus for attaching a dicing tape on a mount frame and a wafer, comprising:
   a fixed table for supporting the mount frame;
   a movable table for supporting the wafer;
   a height adjusting means for adjusting a height of the movable table;

a dicing tape attaching means configured to move in parallel to a dicing tape attaching surface of the wafer to attach the dicing tape on the mount frame and the wafer, wherein when the dicing tape is attached on the mount frame and the wafer, the height adjusting means adjusts a height of the dicing tape attaching surface of the wafer with a height of an upper surface of the mount frame; and a height detection means for detecting the height of the dicing tape attaching surface of the wafer and/or the height of the upper surface of the mount frame, wherein the height adjusting means adjusts the height of the movable table based on the height of the dicing tape attaching surface and/or the height of the upper surface of the mount frame detected by the height detection means.

2. The dicing tape attaching apparatus according to claim 1, wherein the height adjusting means is a screw jack.

3. The dicing tape attaching apparatus according to claim 1 or 2, wherein the dicing tape attaching surface of the wafer is formed by grinding a back surface of the wafer.

4. The dicing tape attaching apparatus according to claim 1, further comprising an input means for inputting a thickness of the wafer, a thickness of the film attached on a surface of the wafer opposite to the dicing tape attaching surface and/or a thickness of the mount frame, wherein the height adjusting means adjusts the height of the movable table based on the thickness of the wafer and the film and/or the thickness of the mount frame input through the input means.

5. The dicing tape attaching apparatus according to claim 1, further comprising:

a pressing means for applying a pressing force by pressing the dicing tape attaching surface of the wafer against the dicing tape attaching means through the dicing tape;

a dicing tape attaching distance calculation means for detecting a distance covered by the dicing tape attaching means when the dicing tape attaching means is moved from one end of the wafer in parallel to the dicing tape attaching surface of the wafer; and a movable table pressing force setting means for setting a pressing force of the movable table using the detected distance in such a manner that a pressure at a contact point of the wafer to the dicing tape is kept substantially constant during the movement of the dicing tape attaching means from one end to the other end of the wafer.

6. The dicing tape attaching apparatus according to claim 5, wherein the pressing means is an air cylinder including a rod, the apparatus further comprising a stopper adapted to stop the rod of the air cylinder before a stroke end thereof

7. The dicing tape attaching apparatus according to claim 5 or 6, wherein the dicing tape attaching means is a roll, and at least a part of the roll is formed of a substantially non-deformable material.

* * * * *